United States Patent
Koo et al.

(10) Patent No.: US 8,405,119 B2
(45) Date of Patent: Mar. 26, 2013

(54) ORGANIC LIGHT EMITTING DIODE LIGHTING APPARATUS

(75) Inventors: Young-Mo Koo, Yongin (KR); Ok-Keun Song, Yongin (KR); Hyuk-Sang Jun, Yongin (KR); Yong-Han Lee, Yongin (KR); Jae-Goo Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/272,043

(22) Filed: Oct. 12, 2011

(65) Prior Publication Data

US 2012/0261713 A1 Oct. 18, 2012

(30) Foreign Application Priority Data

Apr. 18, 2011 (KR) .................. 10-2011-0035832

(51) Int. Cl.
*H01L 33/00* (2010.01)
(52) U.S. Cl. .................. 257/99; 257/E33.055
(58) Field of Classification Search .......... None
See application file for complete search history.

(56) References Cited

U.S. PATENT DOCUMENTS

2004/0004436 A1* 1/2004 Yoneda .................. 313/512

FOREIGN PATENT DOCUMENTS

| JP | 2005-322629 A | 11/2005 |
| KR | 10-2008-0070458 A | 7/2008 |
| KR | 10-2008-0076521 A | 8/2008 |
| KR | 10-2008-0084431 A | 9/2008 |
| KR | 10-2008-0108808 A | 12/2008 |

* cited by examiner

*Primary Examiner* — Ha Tran T Nguyen
*Assistant Examiner* — Kevin Quinto
(74) *Attorney, Agent, or Firm* — Knobbe, Martens, Olson & Bear LLP

(57) ABSTRACT

An organic light emitting diode (OLED) lighting apparatus is disclosed. In one embodiment, the apparatus includes i) a substrate main body including a light emitting area and a sealing area surrounding the light emitting area, ii) an OLED disposed on the light emitting area of the substrate main body, iii) a sealant disposed on the sealing area of the substrate main body and iv) an encapsulation substrate encapsulating the OLED, wherein the encapsulation substrate comprises first and second surfaces opposing each other. The apparatus may further include a heat dissipating wire configured to dissipate heat generated by the OLED. The heat dissipating wire includes a heat absorption portion disposed on the first surface of the encapsulation substrate and contacting the sealant, a heat dissipating portion disposed on the second surface, and a coupling portion interconnecting the absorption portion and the heat dissipating portion.

12 Claims, 1 Drawing Sheet

ORGANIC LIGHT EMITTING DIODE LIGHTING APPARATUS

RELATED APPLICATIONS

This application claims priority to and the benefit of Korean Patent Application No. 10-2011-0035832 filed in the Korean Intellectual Property Office on Apr. 18, 2011, the entire contents of which are incorporated herein by reference.

BACKGROUND

1. Field

The described technology generally relates to a lighting apparatus, more particularly, an organic light emitting diode (OLED) lighting apparatus.

2. Description of the Related Technology

An OLED emits light using energy that is generated when excitons are dropped from an exited state to a ground state after the excitons are formed by coupling electrons and holes in an organic emission layer.

Since OLED lighting apparatuses simply generate light, they have a relatively simple structure compared to an OLED display which generates an image.

In general, an OLED lighting apparatus includes an insulation substrate made of a glass material or an insulation substrate made of a plastic material having comparatively low thermal conductivity. Such insulation substrates, however, cannot radiate heat generated from the OLED to the environment.

The above information disclosed in this Background section is only for enhancement of understanding of the background of the described technology and therefore it may contain information that does not form the prior art that is already known in this country to a person of ordinary skill in the art.

SUMMARY

One inventive aspect is an organic light emitting diode lighting apparatus which has improved heat dissipating efficiency, a prolonged life-span and enhanced durability.

Another aspect is an organic light emitting diode lighting apparatus including a substrate main body including a light emitting area and a sealing area surrounding the light emitting area, an organic light emitting diode disposed on the light emitting area of the substrate main body, a sealant disposed on the sealing area of the substrate main body, and an encapsulation substrate sealed with the substrate main body through the sealant and including a heat dissipating wire. The heat dissipating wire may include a heat absorption portion disposed on one side of the encapsulation substrate, which faces the sealant, a heat dissipating portion disposed on an opposite side of the one side, and a coupling portion for connecting the absorption portion and the heat dissipating portion.

The heat absorption portion may contact a space sealed between the substrate main body and the encapsulation substrate.

The sealant may include a heat transfer material.

The heat transfer material may be a conductive particulate.

The coupling portion may pass through part of the encapsulation substrate.

The heat dissipating wire may include at least one of a metal, a metal oxide, graphite, and silicon.

The encapsulation substrate may be one of a glass substrate, an acryl plastic substrate, and a polyaniline plastic substrate.

The substrate main body may be one of a glass substrate, an acryl plastic substrate, and a polyaniline plastic substrate.

The encapsulation substrate may include a concave portion corresponding to the light emitting area of the substrate main body to be separated from the light emitting diode at the light emitting area.

The encapsulation substrate may include at least one through-hole formed in an area overlapped with the sealant.

The coupling portion may be disposed in the through-hole of the encapsulation substrate.

The coupling portion may be disposed along an outer side of the encapsulation substrate.

The encapsulation substrate may include a third surface interconnecting the first and second surfaces, and the coupling portion may contact the third surface of the encapsulation substrate.

DETAILED DESCRIPTION

Figure 1:
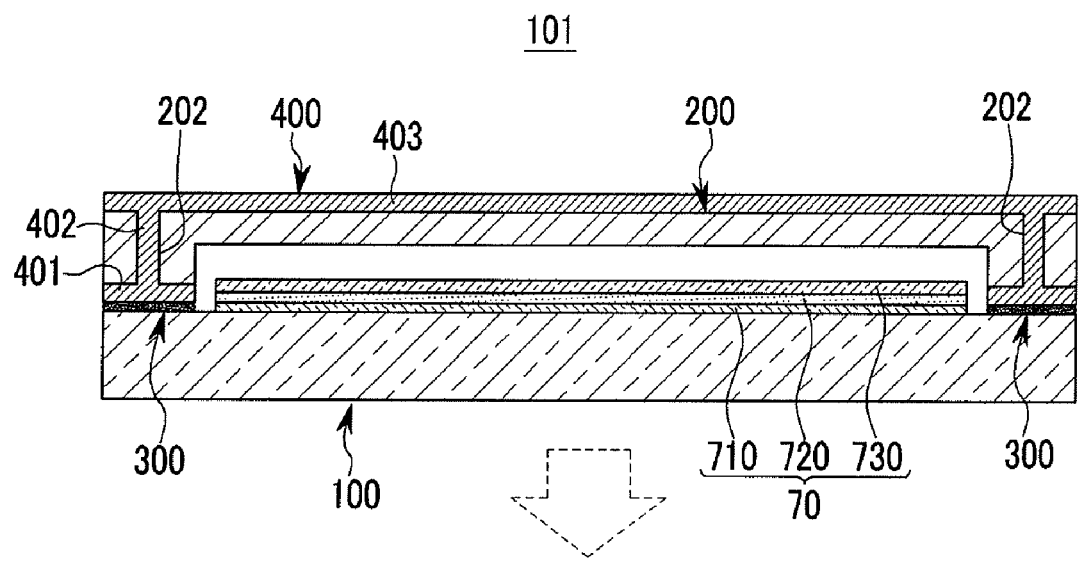
FIG. 1 is a cross-sectional view of an organic light emitting diode lighting (OLED) apparatus according to a first embodiment.

In the following detailed description, only certain embodiments have been shown and described, simply by way of illustration. As those skilled in the art would realize, the described embodiments may be modified in various different ways.

Throughout the specification, the same or similar constituent elements are designated by the same reference numerals. For various embodiments, constituent elements having the same constitution are explained representatively in the first embodiment. In the second embodiments, only the constituent elements different from those in the first embodiment are described.

In the drawings, the size and thickness of each element is approximately shown for better understanding and ease of description. Therefore, the drawings are not considered limiting.

In the drawings, the thickness of layers, films, panels, regions, etc., may be exaggerated for clarity. Further, in the drawings, the thicknesses of layers and regions are exaggerated for better understanding and ease of description. It will be understood that when an element such as a layer, film, region, or substrate is referred to as being "on" another element, it can be directly on the other element or intervening elements may also be present.

Hereinafter, an OLED lighting apparatus 101 according to a first exemplary embodiment will be described with reference to FIG. 1.

As shown in FIG. 1, the OLED lighting apparatus 101 includes a substrate main body 100, an organic light emitting diode (OLED) 70, a sealant 300, and an encapsulation substrate 200.

The substrate main body 100 may be a transparent substrate made of glass, quartz, or ceramic, or may be a plastic substrate made of a material such as acryl, polyimide, and polyaniline.

The substrate main body 100 is divided into a light emitting area, and a sealing area that surrounds the light emitting area.

The organic light emitting diode 70 is disposed on the light emitting area, and the sealant 300 is disposed on the sealing area.

The organic light emitting diode 70 includes a first electrode 710 disposed on the substrate main body 100, an organic emission layer 720 disposed on the first electrode 710, and a second electrode 730 disposed on the organic emission layer 710.

In one embodiment, the first electrode 710 is a hole-injection electrode that injects holes into the organic emission layer 720, and the second electrode 730 is an electron-injection electrode that injects electrons into the organic emission layer 720. The first embodiment, however, is not limited thereto. The first electrode 710 may be an electron-injection electrode and the second electrode 730 may be a hole-injection electrode.

Further, the first electrode 710 may be formed as a transparent conductive layer or a semi-transparent layer. The second electrode 730 may be formed as a reflective layer.

The transparent conductive layer may be include at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO). Such a transparent conductive layer has a comparatively high work function. Therefore, the first electrode 710 formed as the transparent conductive layer can smoothly perform hole injection. When the first electrode 710 is formed as the transparent conductive layer, the OLED lighting apparatus 101 may further include an auxiliary electrode made of a metal having comparatively low resistivity in order to compensate for a comparatively high resistivity of the first electrode 710.

The reflective layer and the semi-transparent layer may be made of metal such as magnesium (Mg), calcium (Ca), lithium (Li), zinc (Zn), aluminum (Al), or alloys thereof. The reflective layer and the semi-transparent layer are determined by thickness. In general, the semi-transparent layer has a thickness that is less than about 200 nm. The light transmittance of the semi-transparent layer increases as the semi-transparent layer becomes thinner. The light transmittance of the semi-transparent layer decreases as the semi-transparent layer becomes thicker.

In the first embodiment, the reflective layer and the semi-transparent layer are the second electrode 730, which is the electron injection electrode. Accordingly, the reflective layer and the semi-transparent layer may be made of a metal having a comparatively lower work function, for example lower than about 4.5 eV.

Furthermore, when the first electrode 710 is formed as a semi-transparent electrode and the second electrode 730 is formed as a reflective layer, light use efficiency can be improved using the microcavity effect.

Moreover, the first electrode 710 may be formed as a multilayer structure including a transparent conductive layer and a semi-transparent layer. In this case, the microcavity effect can be achieved while the first electrode 710 has a comparatively high work function.

The organic emission layer 720 may be formed as a multilayer including at least one of an emission layer, a hole-injection layer (HIL), a hole-transporting layer (HTL), an electron-transporting layer (ETL), and electron-injection layer (EIL). The above layers except the emission layer may be omitted as needed. When the organic emission layer 720 includes all of the described layers, the hole-injection layer (HIL) is disposed on the first electrode 710, which is a hole-injection electrode. The hole-transporting layer (HTL), the emission layer, electron-transporting layer (ETL), and the electron-injection layer (EIL) are sequentially stacked on the hole-injection layer (HIL). Furthermore, the organic emission layer 720 may further include other layers as needed. For example, the organic emission layer 720 may further include a resonance layer for maximizing the microcavity effect.

The OLED lighting apparatus 101 has a bottom emission structure in which light generated from the organic emission layer 720 is emitted to the environment through the first electrode 710 and the substrate main body 100. In FIG. 1, an arrow drawn as a dotted line indicates a direction in which light is emitted.

The sealant 300 is disposed on the sealing area of the substrate main body 100. The sealant 300 may be made of frit or a thermosetting resin. Also, the sealant 300 may include a heat transfer material. For example, a conductive particulate may be used as the heat transfer material.

The encapsulation substrate 200 is sealed with the substrate main body 100 through the sealant 300, thereby covering the organic light emitting diode 70. The encapsulation substrate 200 is a glass substrate or a plastic substrate such as acryl, polyimide, and polyaniline.

Meanwhile, when the substrate main body 100 and the encapsulation substrate 200 are made of the plastic substrate, the OLED lighting apparatus 101 may have flexibility.

Furthermore, the encapsulation substrate 200 has a sunken or a concave portion corresponding to the light emitting area of the substrate main body 100 whereon the OLED 70 is formed. Therefore, the encapsulation substrate 200 is stably separated from the organic light emitting diode 70 while the encapsulation substrate 200 is sealed with the substrate main body 100 through the sealant 500. Accordingly, the encapsulation substrate 200 protects the organic light emitting element 70 from damage.

Further, the encapsulation substrate 200 includes a heat dissipating wire 400. The heat dissipating wire 400 includes at least one of a metal, a metal oxide, graphite, and silicon. For example, the heat dissipating wire 400 may include at least one of Al, Ag, Au, Cr, Mg, Mo, W, and Cu.

The heat dissipating wire 400 includes a heat absorption portion 401, a heat dissipating portion 403, and a coupling portion 402. The heat absorption portion 401 is disposed on one side of the encapsulation substrate 200, which faces the sealant 300. The heat dissipating portion 403 is disposed on the opposite side of the one side facing the sealant 300. The coupling portion 402 connects the heat absorption portion 401 and the heat dissipating portion 403.

The heat absorption portion 401 absorbs heat generated by the organic light emitting diode 70. The heat absorption portion 401 may contact a space sealed between the substrate main body 100 and the encapsulation substrate 200. The larger is the area where the heat absorption portion 401 contacts the sealed area, the more effectively the heat absorption portion 401 absorbs the heat generated by the organic light emitting diode 70. The heat transfer material included in the sealant 300 assists the heat absorption portion 401 to absorb heat radiated from the organic light emitting diode 70.

The heat dissipating portion 403 radiates the heat absorbed by the heat absorption portion 401 to the environment. The heat dissipating efficiency improves as the heat dissipating portion 403 becomes larger. Accordingly, the heat dissipating portion 403 may be formed over the entire outer surface of the encapsulation substrate 200 in order to maximize the heat dissipating efficiency.

The coupling portion 402 transfers the absorbed heat of the heat absorption portion 401 to the heat dissipating portion 403. In the first embodiment, the encapsulation substrate 200 may further include at least one of through-holes 202 formed at one area overlapped with the sealant 300, and the coupling portion 402 of the heat dissipating wire 400 is disposed in the through-hole 202 of the encapsulation substrate 200.

As described above, the OLED lighting apparatus 101 has a structure that can effectively radiate heat generated from the OLED 70 to the environment. Accordingly, deterioration of the organic light emitting element 70 by heat can be suppressed, and the life-span and durability of the OLED lighting apparatus 101 can be improved.

Hereinafter, an organic light emitting diode (OLED) lighting apparatus according to a second exemplary embodiment will be described with reference to FIG. 2.

Figure 2:
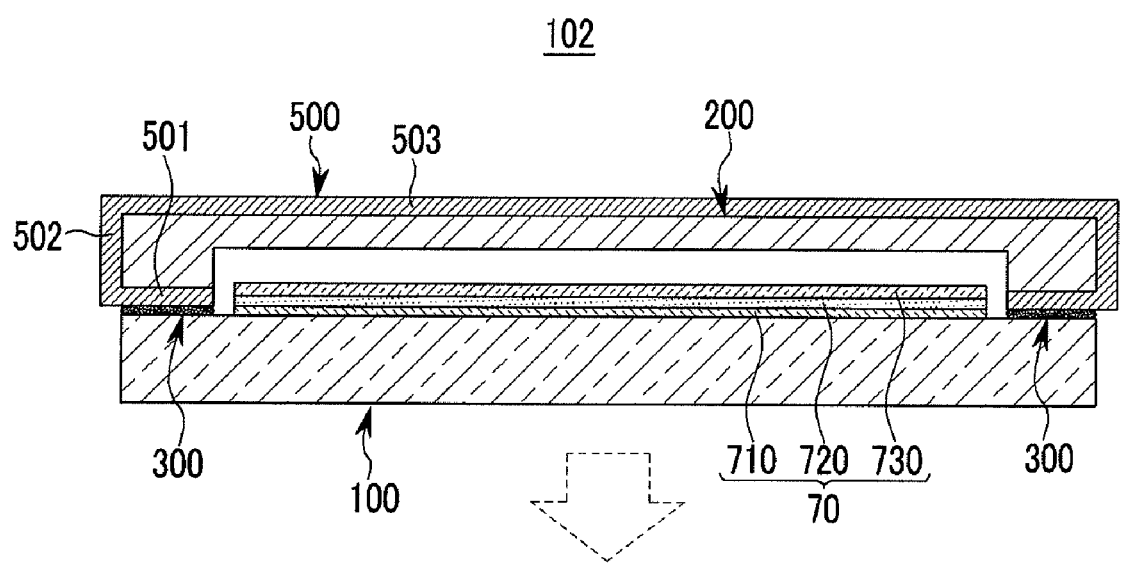
FIG. 2 is a cross-sectional view of an OLED lighting apparatus according to a second embodiment.

As shown in FIG. 2, an OLED lighting apparatus 102 includes a heat dissipating wire 500 having a coupling portion 502 formed along an outer side of an encapsulation substrate 200. That is, except an area facing the light emitting area of the substrate main body 100, the encapsulation substrate 200 is substantially entirely surrounded by a heat absorption portion 501, a coupling portion 502, and a heat dissipating portion 503 of the heat dissipating wire 500. Accordingly, the heat dissipating wire 500 may have further improved heat dissipating efficiency.

Like the first embodiment, the heat absorption portion 501 may contact a sealed space between the substrate main body 100 and the encapsulation substrate 200.

As described above, the OLED lighting apparatus 102 has a structure that can effectively radiate the heat generated from the organic light emitting diode 70.

Hereinafter, an experimental example according to the first embodiment will be compared with a comparative example with reference to Table 1.

The experimental example includes a heat dissipating wire according to the first embodiment. The comparative example has a structure including a simple heat dissipating layer at one side of an encapsulation substrate.

TABLE 1

| thickness (μm) | Experimental Example temperature (° C.) | Comparative Example temperature (° C.) |
|---|---|---|
| 2 | 82.05 | 83.75 |
| 50 | 78.25 | 83.75 |
| 200 | 66.16 | 83.75 |
| 500 | 52.25 | 83.75 |
| 1000 | 41.44 | 83.75 |

As shown in Table 1, the experimental example according to the first embodiment has better heat dissipating efficiency than that of the comparative example. Particularly, the heat dissipating efficiency is greatly improved as the heat dissipating wire becomes thicker. On the contrary, the heat dissipating efficiency of the comparative example is not improved although the heat dissipating layer becomes thicker.

At least one of the disclosed embodiments can improve heat dissipating efficiency of an OLED lighting apparatus. Furthermore, degradation of an OLED element by heat can be suppressed, and the life-span and durability of the OLED lighting apparatus can be improved.

While embodiments have been described in connection with the accompanying drawings, it is to be understood that the disclosed embodiments are not considered limiting and are intended to cover various modifications and equivalent arrangements included within the spirit and scope of the appended claims.

What is claimed is:

1. An organic light emitting diode (OLED) lighting apparatus, comprising:
   a substrate main body including a light emitting area and a sealing area surrounding the light emitting area;
   an organic light emitting diode (OLED) disposed on the light emitting area of the substrate main body;
   a sealant disposed on the sealing area of the substrate main body;
   an encapsulation substrate encapsulating the OLED, wherein the encapsulation substrate comprises first and second surfaces opposing each other, and wherein the first surface is closer to the substrate main body than the second surface; and
   a heat dissipating wire configured to dissipate heat generated by the OLED, wherein the heat dissipating wire includes i) a heat absorption portion disposed on the first surface of the encapsulation substrate and contacting the sealant, ii) a heat dissipating portion disposed on the second surface, and iii) a coupling portion interconnecting the absorption portion and the heat dissipating portion.

2. The OLED lighting apparatus of claim 1, wherein the heat absorption portion contacts a space sealed between the substrate main body and the encapsulation substrate.

3. The OLED lighting apparatus of claim 1, wherein the sealant is formed of a heat transfer material.

4. The OLED lighting apparatus of claim 3, wherein the heat transfer material is a conductive particulate.

5. The OLED lighting apparatus of claim 1, wherein the coupling portion passes through part of the encapsulation substrate.

6. The OLED lighting apparatus of claim 1, wherein the heat dissipating wire is formed of at least one of a metal, a metal oxide, graphite, and silicon.

7. The OLED lighting apparatus of claim 1, wherein the encapsulation substrate is one of a glass substrate, an acryl plastic substrate, and a polyaniline plastic substrate.

8. The OLED lighting apparatus of claim 1, wherein the substrate main body is one of a glass substrate, an acryl plastic substrate, and a polyaniline plastic substrate.

9. The OLED lighting apparatus of claim 1, wherein the encapsulation substrate includes a concave portion corresponding to the light emitting area of the substrate main body to be separated from the light emitting diode at the light emitting area.

10. The OLED lighting apparatus of claim 1, wherein at least one through-hole is defined in the encapsulation substrate so as to at least partially overlap with the sealant.

11. The OLED lighting apparatus of claim 10, wherein the coupling portion is disposed in the through-hole of the encapsulation substrate.

12. The OLED lighting apparatus of claim 1, wherein the encapsulation substrate comprises a third surface interconnecting the first and second surfaces, and wherein the coupling portion contacts the third surface of the encapsulation substrate.

* * * * *